(12) United States Patent
Spyropoulos et al.

(10) Patent No.: US 9,364,870 B2
(45) Date of Patent: **\*Jun. 14, 2016**

(54) ULTRASONIC CLEANING METHOD AND APPARATUS THEREFORE

(71) Applicant: Lam Research Corporation, Fremont, CA (US)

(72) Inventors: Evangelos T. Spyropoulos, San Jose, CA (US); Iqbal A. Shareef, Fremont, CA (US); Clifford Erik La Croix, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/926,575

(22) Filed: Oct. 29, 2015

(65) Prior Publication Data

US 2016/0045941 A1 Feb. 18, 2016

Related U.S. Application Data

(63) Continuation of application No. 13/711,962, filed on Dec. 12, 2012, now Pat. No. 9,174,249.

(51) Int. Cl.
*B08B 3/12* (2006.01)
*G02B 27/00* (2006.01)
(Continued)

(52) U.S. Cl.
CPC .............. *B08B 3/12* (2013.01); *G02B 27/0006* (2013.01); *H01J 37/32862* (2013.01); *A47L 2601/17* (2013.01); *B08B 1/00* (2013.01); *B08B 3/00* (2013.01); *B08B 3/044* (2013.01);
(Continued)

(58) Field of Classification Search
CPC ...... A47L 2601/17; B08B 3/044; B08B 3/10; B08B 3/12; B08B 3/00; B08B 3/045; B08B 3/047; B08B 3/048; B08B 3/108; B08B 11/00; B08B 11/02; B08B 11/04
See application file for complete search history.

(56) References Cited

U.S. PATENT DOCUMENTS

| 2,203,204 A | 6/1940 | Nicolai |
| 3,631,546 A | 1/1972 | Eliasson |

(Continued)

FOREIGN PATENT DOCUMENTS

CN 2889529 4/2007

OTHER PUBLICATIONS

Notice of Allowance dated Jun. 30, 2015 from U.S. Appl. No. 13/711,962.

*Primary Examiner* — Bibi Carrillo
(74) *Attorney, Agent, or Firm* — Beyer Law Group LLP

(57) ABSTRACT

Ultrasonic cleaning apparatuses and methods of cleaning substantially planar articles. An apparatus comprises (i) a substantially circular tank; (ii) a plurality of cleaning fluid inlets for delivering a cleaning fluid to the tank; (iii) an intermediate support for receiving an article to be cleaned; and (iv) an ultrasonic generator coupled to the tank for generating ultrasonic waves in the tank and cleaning fluid received therein. The apparatus is configured to remove particles from a substantially planar article and have them carried by flow of cleaning fluid away from the article and out of the tank. Using such an apparatus, a cleaning method comprises introducing a substantially planar article to be cleaned into the tank; introducing a cleaning fluid into the tank through the plurality of cleaning fluid inlets; and exciting the cleaning fluid with ultrasonic waves.

4 Claims, 5 Drawing Sheets

(51) Int. Cl.
*H01J 37/32* (2006.01)
*B08B 3/10* (2006.01)
*B08B 3/04* (2006.01)
*B08B 11/04* (2006.01)
*B08B 11/00* (2006.01)
*B08B 1/00* (2006.01)
*B08B 3/00* (2006.01)
*B08B 11/02* (2006.01)

(52) U.S. Cl.
CPC .............. *B08B 3/045* (2013.01); *B08B 3/047* (2013.01); *B08B 3/048* (2013.01); *B08B 3/10* (2013.01); *B08B 3/108* (2013.01); *B08B 11/00* (2013.01); *B08B 11/02* (2013.01); *B08B 11/04* (2013.01); *B08B 2209/005* (2013.01)

(56) References Cited

U.S. PATENT DOCUMENTS

| | | |
|---|---|---|
| 4,037,871 A | 7/1977 | Bourgraf et al. |
| 4,921,295 A | 5/1990 | Stollenwerk |
| 5,431,087 A | 7/1995 | Kambara |
| 6,311,952 B2 | 11/2001 | Bainter |
| 7,631,373 B2 | 12/2009 | Broadley et al. |
| 2002/0056162 A1 | 5/2002 | Flynn et al. |
| 2006/0096029 A1 | 5/2006 | Osborne et al. |
| 2008/0128571 A1 | 6/2008 | Dostaler et al. |
| 2009/0165208 A1 | 7/2009 | Reed et al. |
| 2009/0172883 A1 | 7/2009 | Benedict et al. |
| 2009/0241987 A1 | 10/2009 | Serizawa et al. |
| 2009/0313758 A1 | 12/2009 | Menkedick et al. |
| 2014/0158153 A1* | 6/2014 | Spyropoulos ............. B08B 3/12 134/1 |

* cited by examiner

ULTRASONIC CLEANING METHOD AND APPARATUS THEREFORE

CROSS REFERENCE TO RELATED APPLICATIONS

This application is a continuation of and claims priority under 35 USC §120 to co-pending U.S. patent application Ser. No. 13/711,962 filed on Dec. 12, 2012, now U.S. Pat. No. 9,174,249, entitled "Ultrasonic Cleaning Method and Apparatus Therefore" which is hereby incorporated by reference for all purposes.

FIELD

This disclosure relates to methods of ultrasonically cleaning articles and apparatuses therefore, and more particularly to methods and apparatuses for cleaning quartz windows of plasma processing chambers.

BACKGROUND

In industrial processes, component surfaces are typically exposed to environments that erode or contribute to build-up on such surfaces. Thus, new components must be cleaned before first use, and over time, surfaces of such components must be cleaned in order for them to continue to be useful. Otherwise, such surfaces (or whole components) must be replaced. Due to cost concerns, cleaning a surface is often preferable to replacement. However, certain surfaces are difficult to clean due to the nature of the component and the environment to which it is exposed. For example, semiconductor substrate materials (such as silicon wafers) are processed in plasma processing chambers wherein interior and interior-facing surfaces are exposed to deposition, etching, and stripping environments. Thus, accumulation of inorganic and organic contaminates on component surfaces is commonly observed and can cause product contamination, reduction in processing efficiency, or both.

One example of a surface in a plasma processing chamber is a quartz ($SiO_2$) surface. Chamber components having such a surface include, but are not limited to, windows and view ports (collectively, "windows"). Through the processing of semiconductor substrate materials, organic materials (for example, finger oils, grease, particles and organic compounds); metals (for example, aluminum, molybdenum, and tungsten); dielectric materials (for example, silicon dioxide and silicon nitride); and other inorganic materials can become deposited onto such windows. Such windows are typically cleaned in an ultrasonic bath. However, conventional baths and cleaning methods suffer from an inability to provide particle-free, or consistently particle-free, results. This is because such baths and methods fail to remove all particles from the window or some of the particles that do get removed recirculate in the bath and redeposit on the window.

Whether cleaning plasma processing chamber components or other articles, there remains a need for better cleaning apparatuses and methods of obtaining ultra-clean articles.

SUMMARY

The present disclosure provides, in various embodiments, a novel ultrasonic cleaning apparatus and methods of obtaining an ultra-clean article using said apparatus. In some of the various embodiments, the ultrasonic cleaning apparatus comprises (i) a substantially circular tank; (ii) a plurality of cleaning fluid inlets for delivering a cleaning fluid to the tank; (iii) an intermediate support for receiving an article to be cleaned; and (iv) an ultrasonic generator coupled to the tank for generating ultrasonic waves in the tank and cleaning fluid received therein. The provided apparatus is configured to deliver and receive cleaning fluid to the tank via the inlets, remove particles from an article supported in the tank and cleaning fluid, and direct flow of cleaning fluid such that removed particles are carried away from the article and out of the tank with low incidence of recirculation (stagnation) within the tank. Thus, the apparatus is configured to remove particles and inhibit redeposition thereof onto the article.

In some of the various embodiments, the provided methods of cleaning an article comprise (i) providing an ultrasonic cleaning apparatus described herein; (ii) introducing an article to be cleaned into the tank; (iii) introducing a cleaning fluid into the tank through the plurality of cleaning fluid inlets; and (iv) exciting the cleaning fluid with ultrasonic waves.

Although the present disclosure is not intended to be limited to a particular article to be cleaned or a particular application, in some embodiments the provided apparatus and methods are configured to clean quartz articles of a plasma processing chamber. As used herein, a "quartz article" means a component having at least one quartz surface. Examples of such articles include, but are not limited to, dielectric windows, process gas injectors, injection rings, view ports, plasma confinement rings, focus rings and edge rings surrounding a substrate on a substrate support, and gas distribution plates and baffles for distributing process gases. Such articles have various shapes, and the provided apparatus (and various components thereof) may be configured to accommodate such shapes. Thus, in some embodiments, the provided apparatus and methods are configured to clean substantially planar quartz articles. An example of such an article is a quartz window. In such embodiments, the window can be placed into the tank such that a plasma-facing surface of the window is oriented to face the bottom portion of the tank and the opposing exterior-facing surface of the window is oriented to face the top portion of the tank.

BRIEF DESCRIPTION OF THE DRAWINGS

A more complete appreciation of the many embodiments of the present disclosure will be readily obtained as the same becomes better understood by reference to the following detailed description when considered in connection with the accompanying drawings, wherein.

DETAILED DESCRIPTION

Figure 1:
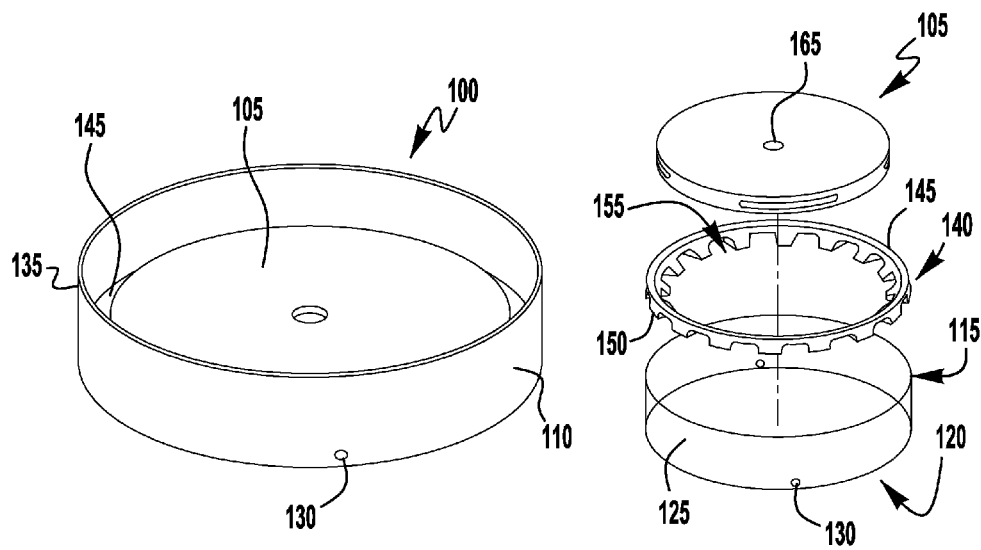
FIG. 1 illustrates one example of a provided ultrasonic cleaning apparatus and assembly thereof with a substantially planar article to be cleaned.

Specific embodiments of the present disclosure will now be described. The invention may, however, be embodied in different forms and should not be construed as limited to the embodiments set forth herein. Rather, these embodiments are provided so that this disclosure will be thorough and complete and will fully convey the scope of the same to those skilled in the art.

Unless otherwise defined, all technical and scientific terms used herein have the same meaning as commonly understood by one of ordinary skill in the art to which this disclosure belongs. The terminology used in the present disclosure is for describing particular embodiments only and is not intended to be limiting. As used in the specification and appended claims, the singular forms "a," "an," and "the" are intended to include the plural forms as well, unless the context clearly indicates otherwise.

It is noted that recitations herein of "at least one" component, element, etc., should not be used to create an inference that the alternative use of the articles "a" or "an" should be limited to a single component, element, etc.

It is noted that recitations herein of a component of the present disclosure being "configured" to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

It is further noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Unless otherwise indicated, all numbers expressing quantities, properties, conditions, and so forth as used in the specification and claims are to be understood as being modified in all instances by the term "about." Additionally, the disclosure of any ranges in the specification and claims are to be understood as including the range itself and also anything subsumed therein, as well as endpoints. Notwithstanding that numerical ranges and parameters setting forth the broad scope of the disclosure are approximations, the numerical values set forth in the specific examples are reported as precisely as possible. Any numerical values, however, inherently contain certain errors necessarily resulting from error found in their respective measurements.

Apparatus

In various embodiments of the present disclosure, provided is an ultrasonic cleaning apparatus configured to deliver and receive cleaning fluid from a plurality of cleaning fluid inlets, remove particles from an article to be cleaned, and direct flow of cleaning fluid such that removed particles are carried away from the article and out of a tank. Additionally, the apparatus is configured to carry removed particles out of the tank with low incidence of recirculation (stagnation) within the tank, thereby inhibiting redeposition onto the cleaned article. In some of the various embodiments, the provided apparatus comprises (i) a substantially circular tank comprising a top portion, a bottom portion, and a sidewall disposed therebetween; (ii) a plurality of cleaning fluid inlets for delivering a cleaning fluid to the tank; (iii) an intermediate support for receiving an article to be cleaned, the support configured to maintain the article submerged in cleaning fluid but above the plurality of cleaning fluid inlets; and (iv) an ultrasonic generator coupled to the tank for generating ultrasonic waves in the tank and cleaning fluid received therein.

The provided apparatus comprises a "substantially circular" tank. Thus, the tank may have a uniform radius, or it may have a radius that deviates somewhat (i.e., not a perfect circle). It is also contemplated that a tank having a similar shape may also be substituted without deviating from the general scope of the present disclosure. For example, an oval tank is specifically contemplated. Whether circular, substantially circular, or oval, the provided tank comprises a top portion, a bottom portion, and a sidewall disposed therebetween. In some embodiments, the bottom portion and sidewall may be integrally formed. In some embodiments, the bottom portion and sidewall are separate components that are mechanically joined such that a cleaning fluid can be received by the tank without leakage. While the top portion is typically open, it also may comprise a lid. The sidewall may also comprise a plurality of apertures proximate to the bottom portion, such apertures being configured to at least partially receive the cleaning fluid inlets. In some embodiments, such apertures (and associated cleaning fluid inlets) may be equidistantly spaced around the circumference of the tank sidewall. The sidewall additionally may comprise a plurality of apertures proximate to the top portion, such apertures being configured to be outlet ports for cleaning fluid and removed particles carried by the flow thereof through the tank. Such fluid outlet ports may be the apertures themselves or be an article (such as a nozzle, tube, injector, or connector) at least partially disposed therein. In some embodiments, such apertures (and associated fluid outlet ports) may be equidistantly spaced around the circumference of the tank sidewall. The number of fluid outlet ports proximate to the top portion of the tank may be the same as or different from the number of cleaning fluid inlets proximate to the bottom portion of the tank. As non-limiting examples, the apparatus may be configured to have two cleaning fluid inlets and two fluid outlet ports; four cleaning fluid inlets and four fluid outlet ports; four cleaning fluid inlets and two fluid outlet ports; or six cleaning fluid inlets and two fluid outlet ports.

The provided apparatus also comprises an intermediate support. The support can be manufactured from a variety of materials, provided that such materials are suitable for the specific application. A non-limiting example of a material of construction is polytetrafluoroethylene (Teflon®; DuPont). In addition to materials of construction, the design of the intermediate support can also be tailored to meet the needs of a specific application. The provided intermediate support comprises an upper support surface and a base structure opposite the upper support surface and is configured to define a plurality of radial cleaning fluid passages extending through the base structure from the outer circumference of the support to an inner circumference of the support. The inner circumference of the intermediate support can be modified to allow more or less of the bottom-facing surface of the article to be cleaned to be directly contacted by cleaning fluid. The outer circumference of the intermediate support is, in some embodiments, approximately equal to an inner circumference of the tank sidewall.

The provided intermediate support is configured such that when disposed in the tank, the base structure contacts the bottom portion of the tank and the plurality of inlets are disposed within the plurality of radial cleaning fluid passages of the support. Thus, the article to be cleaned is maintained by the support within the cleaning fluid above the plurality of inlets. In some embodiments, the intermediate support can be configured to define one or both of (i) a substantially continuous outer circumferential fluid gap between a substantial entirety of an outer circumference of the support and an inner circumference of the tank; and (ii) a substantially discontinuous inner circumferential fluid gap between an intermediate circumference of the support and a substantially planar article supported by the upper support surface of the support. In some embodiments, the article to be cleaned has one or more apertures, and the provided apparatus is configured to direct flow of cleaning fluid from the plurality of inlets through such apertures.

As indicated, the provided apparatus comprises a plurality of inlets for delivering a cleaning fluid to the tank. In some embodiments, each cleaning fluid inlet is equidistantly spaced from the other. For example, in such embodiments an apparatus having two inlets would have such inlets oriented 180° from each other around the circumference of the tank. Similarly, an apparatus of such embodiments having three inlets would have such inlets oriented 120° from each other around the circumference of the tank. As another example of such embodiments, if an apparatus has four inlets, each would be oriented 90° from the neighboring inlet. Moreover, in such an apparatus having six inlets, each would be oriented 60° from the neighboring inlet. The base structure of the intermediate support can be configured to accommodate one, two, three, four, five, six, or more inlets, each inlet being disposed within a radial cleaning fluid passage of the support.

The provided apparatus is configured to direct cleaning fluid such that removed particles are carried away from the article and out of the tank with low incidence of recirculation. Thus, the apparatus is configured to provide an ultra-clean article by removing particles and inhibiting redeposition thereof onto the article. In part, selection of the number of cleaning fluid inlets helps to achieve desired flow hydrodynamics. Selection of the type of cleaning fluid inlet is another factor for achieving such flow hydrodynamics. Suitable cleaning fluid inlets include, but are not limited to, nozzle injectors (also referred to a jet injectors), fan injectors, and combinations thereof. Thus, an apparatus having only nozzle injectors, an apparatus having only fan injectors, and an apparatus having nozzle and fan injectors are all contemplated.

In some embodiments, the provided apparatus comprises cleaning fluid inlets that are nozzle injectors. Such nozzle injectors may be straight (directing flow to the center of the tank) or may be angled (directing flow to a predetermined offset). Angled nozzle injectors may be selected when greater vorticle motion of cleaning fluid is desired. Accordingly, when an angled nozzle injector is used, it is typically configured to direct fluid flow in the same general direction as a neighboring angled nozzle injector. In some embodiments, the cleaning fluid inlets of the apparatus are angled nozzle injectors, each having an offset angle of 20° (with respect to a line through the center of the tank). However, other offset angles are also within the scope of the present disclosure. For example, nozzle injectors having an offset angle of 0°-10°, 10°-20°, 20°-30°, 30°-40°, 40°-50°, 50°-60°, 60°-70°, 70°-80°, and 80°-90° are specifically contemplated. For clarity, an offset angle of 0° means that flow is directed along a line through the center of the tank, and an offset angle of 90° means that flow is directed perpendicular to a line through the center of the tank. In some embodiments, the provided apparatus comprises four angled nozzle injectors, each having an offset angle of 20°.

In some embodiments, the provided apparatus comprises cleaning fluid inlets that are fan injectors. Such injectors can be configured as single-slotted injectors or multi-slotted fan injectors, each slot configured to introduce fluid in a fan (or arc) of a predetermined coverage angle. In some embodiments, the cleaning fluid inlets of the apparatus are single-slotted injectors. For example, the apparatus may comprise single-slotted injectors wherein the fan coverage angle is from 0°-30°, 30°-60°, 60°-90°, 90°-120°, 120°-150°, and 150°-180°. For clarity, a fan coverage angle of 0° means that there is no fan of fluid, a fan coverage angle of 60° means that fluid is injected in a fan (arc) of 60°, and a fan coverage angle of 180° means that fluid is injected in a fan (arc) of 180°. With respect to fluid injection, the cleaning fluid inlets can be configured to orient the fan in various ways. For example, with a fan coverage of 90°, the fan can be oriented such that the fan coverage is along a line through the center of the tank and throughout a fan that is 90° therefrom, or the fan can be oriented such that the fan is along a line through the center of the tank and throughout 45° in opposing directions therefrom. In some embodiments, the provided apparatus comprises two or four single-slotted fan injectors, each slot configured to introduce fluid in a fan of 90°, 120°, or 180° coverage.

The cleaning fluid inlets of the apparatus may, in some embodiments, be multi-slotted injectors, such injectors having two, three, four, five, six, seven, or more slots. As with the single-slotted injector, each slot is configured to introduce fluid in a fan of a predetermined coverage angle. For example, the apparatus may comprise multi-slotted injectors wherein the fan coverage angle of each slot is independently selected from 0°-30°, 30°-60°, 60°-90°, 90°-120°, 120°-150°, and 150°-180°. A multi-slotted injector can have slots arranged in the same or different planes. For example, a two-slotted injector can have two adjacent slots existing in the same plane or two slots on top of each other (i.e., in different planes). In those embodiments wherein slots exist in the same plane, the inlet can be configured such that the fans of the slots do or do not overlap. For example, a two-slotted injector having two 120° fans in the same plane can be configured to provide a cumulative fan coverage angle of 180°, wherein there is 60° overlap. As another example, a two-slotted injector having two 90° fans in the same plane can be configured to provide a cumulative fan coverage angle of 180°, wherein there is no overlap. Moreover, coverage gaps may also be introduced between fans. In those embodiments wherein slots exist in separate planes, the slots can be configured to be on top of each other. For example, an injector may have seven slots on top of each other, each slot having the same or different fan coverage angle of a neighboring slot. In some embodiments, the provided apparatus may comprise two seven-slotted fan injectors, each slot configured to introduce fluid in a fan of 180° coverage.

As indicated, the apparatus is configured to support an article (for example, a substantially planar article) above the plurality of cleaning fluid inlets such that the surface of the article oriented to face the bottom of the tank is directly contacted with cleaning fluid. The apparatus is also configured such that the surface of the article oriented to face the top of the tank is also contacted with cleaning fluid. After being injected into the tank via the cleaning fluid inlets, the cleaning fluid flows by the bottom-facing surface of the article and towards the top of the tank. More particularly, the fluid flows towards (and out of) the plurality of fluid outlet ports proximate to the top portion of the tank and in such process also flows by the top-facing surface of the article. Thus, in those embodiments wherein the intermediate support is configured such that there is limited flow of cleaning fluid between the outer circumference of the support and the inner circumference of the tank sidewall, there must be some other pathway by which the cleaning fluid can flow from (and by) the bottom-facing surface to (and by) the top-facing surface of the article. Similarly, in those embodiments wherein the support is configured such that there is little or no flow of cleaning fluid between the support and the article to be cleaned, there must be some other pathway by which the cleaning fluid can flow from (and by) the bottom-facing surface to (and by) the top-facing surface of the article. In some embodiments, the article to be cleaned has one or more apertures, and the provided apparatus is configured such that the main flow of cleaning fluid is directed from the plurality of cleaning fluid inlets, by the bottom-facing surface of the article, through the one or more apertures of the article, by the top-facing surface of the article, and to (and out of) the plurality of fluid outlet ports proximate to the top portion of the tank. In such embodiments, the apparatus may be configured such that there is vortical motion of cleaning fluid below the bottom-facing surface of the article, above the top-facing surface of the article, or both.

The provided apparatus additionally comprises an ultrasonic generator coupled to the tank. While ultrasonic generators are generally familiar to those of skill in the art, a suitable one for the provided apparatus is one capable of providing suitable power density for an application. The size of the tank is one factor in selection of a suitable generator.

In certain embodiments, the provided apparatus is specifically configured to receive and clean plasma processing chamber windows. In such embodiments, the intermediate support is configured to receive a substantially planar window that is placed into the tank with the plasma-facing surface of the window oriented toward the bottom portion of the tank and the opposing exterior-facing surface of the window oriented toward the top portion of the tank. However, the intermediate support could alternatively be configured to receive the window in the opposite orientation. A plasma processing chamber window may have one or more apertures. For example, a single aperture disposed in the center of a round window. For such a window, the provided apparatus is configured such that the main flow of cleaning fluid is directed from the plurality of inlets, by the plasma-facing surface of the window (when oriented to face the bottom portion of the tank), through the window aperture, by the exterior-facing surface of the window (when oriented to face the top portion of the tank), and to (and out of) the plurality of fluid outlet ports proximate to the top portion of the tank. In such embodiments, at least the plasma-facing surface of the window is contacted with ultrasonic waves. Optionally, the exterior-facing surface may also be contacted with ultrasonic waves. In either instance, the apparatus is configured to remove particles from the window surfaces and carry them away from the article with low incidence of recirculation (stagnation) within the tank, thereby inhibiting redeposition onto the window. Thus, the apparatus is suitable for use in providing an ultra-clean window.

Methods

In various embodiments of the present disclosure, also provided are methods of cleaning an article. Such methods comprise (i) providing an ultrasonic cleaning apparatus as described herein; (ii) introducing an article to be cleaned into the tank of the apparatus; (iii) introducing a cleaning fluid into the tank through the plurality of inlets of the apparatus; and (iv) exciting the cleaning fluid with ultrasonic waves. In some embodiments, the provided methods are directed to cleaning a substantially planar article, including a plasma processing chamber window.

The provided cleaning apparatus comprises an intermediate support for receiving the article to be cleaned. The provided intermediate support comprises an upper support surface and a base structure opposite the upper support surface and is configured to define a plurality of radial cleaning fluid passages extending through the base structure from the outer circumference of the support to an inner circumference of the support. In some embodiments, the support has an open interior portion that enables cleaning fluid to directly contact at least one surface of the article oriented to face the bottom portion of the tank. The intermediate support is configured such that when disposed in the tank, the base structure contacts the bottom portion of the tank and the plurality of cleaning fluid inlets are disposed within the plurality of radial cleaning fluid passages. Thus, the article to be cleaned is maintained by the support in the cleaning fluid above the plurality of cleaning fluid inlets. In some embodiments of the provided methods, the article to be cleaned can be received by the support outside of the tank, and the support and received article can be subsequently introduced into the tank. In other embodiments, the support can be disposed within the tank and the article to be cleaned can be received by such support while still in the tank.

The provided cleaning apparatus comprises a plurality of cleaning fluid inlets for delivering a cleaning fluid to the tank. Suitable cleaning fluid inlets include, but are not limited to, nozzle injectors (also referred to a jet injectors), fan injectors, and combinations thereof. In the provided methods, cleaning fluid is introduced into the tank through the plurality of cleaning fluid inlets. The tank may or may not contain cleaning fluid prior to the introduction of the article to be cleaned. In either instance, once the article has been introduced into the tank, cleaning fluid is introduced into the tank through the plurality of cleaning fluid inlets. Cleaning fluid may be introduced into the tank through an inlet a predetermined flow rate. For example, cleaning fluid may be introduced into the tank through cleaning fluid inlets at a flow rate of 0-1 L/minute, 1-2 L/minute, 2-3 L/minute, 3-4 L/minute, or 4-5 L/minute. It is also contemplated that the flow rate of one inlet of the apparatus may the same or different from the flow rate of another inlet of the apparatus. In some embodiments, the cleaning fluid is introduced into the tank a continuous flow rate (for example, continuously at 2 L/minute). In some embodiments, the cleaning fluid is introduced into the tank at a variable flow rate (for example, initially at a flow rate of 2 L/minute and subsequently at a reduced flow rate). In some embodiments, one or more pauses in flow may be introduced (for example, an initial flow of 2 L/minute, a pause of 10 seconds, and a subsequent flow of 2 L/minute). In such embodiments, the length of the pause can be suited to the particular application and article to be cleaned. As non-limiting examples, the pause can be 0-5 seconds, 5-10 seconds, 10-15 seconds, or 15-20 seconds.

Once cleaning fluid is introduced into the tank, it flows from the plurality of cleaning fluid inlets, by at least the surface of the article oriented to face the bottom portion of the tank, to (and by) the surface of the article oriented to face the top portion of the tank, and to (and out of) the plurality of cleaning fluid outlets proximate to the top portion of the tank. The hydrodynamics of the cleaning fluid flow are configured to carry particles removed from the article away from the article and out of the tank with low incidence of recirculation within the tank, thereby inhibiting particle redeposition. In those embodiments wherein the method comprises pausing the flow rate, such pause may be used to help disrupt recirculation of removed particles within the tank.

The cleaning fluid introduced into the tank can be any fluid suitable for the application and suitable for use with ultrasound. In some embodiments, the cleaning fluid can be water, an organic solvent, an acidic solution, or a basic solution. For example, the cleaning fluid can be selected from water ($H_2O$), methanol ($CH_3OH$), ethanol ($C_2H_5OH$), isopropyl alcohol ($C_3H_7OH$), acetone ($C_3H_6O$), ammonium hydroxide ($NH_4OH$), hydrogen peroxide ($H_2O_2$), hydrochloric acid (HCl), hydrofluoric acid (HF), nitric acid ($HNO_3$), acetic acid ($C_2H_4O_2$), or combinations thereof. In the provided methods, one cleaning fluid (or combination of cleaning fluids) can be introduced into the tank and the article contacted therewith, followed by flushing of such cleaning fluid from the tank and subsequent introduction of a different cleaning fluid (or combination of cleaning fluids) into the tank. In some embodiments, it is contemplated that the apparatus may further comprise a heating or cooling element and the introduced cleaning fluid may be heated or cooled as needed for a particular application.

Once cleaning fluid has been introduced into the tank, it is excited by ultrasonic waves. At least the surface of the article oriented to face the bottom portion of the tank is contacted with ultrasonic waves. Optionally, other surfaces (including the surface oriented to face the top portion of the tank) may also be contacted with ultrasonic waves. The ultrasonic power density used can be that suitable for a particular application and article. For example, power density may be 5-10 W/in$^2$, 10-15 W/in$^2$, 15-20 W/in$^2$, or 20-25 W/in$^2$. In some embodiments, ultrasonic waves may be introduced at a continous power density (for example, continuously at 15 W/in$^2$). In some embodiments, the ultrasonic source of the apparatus may have an adjustable frequency or strength of waves to be generated and such waves are introduced at a variable power density (for example, initially at 15 W/in$^2$ and subsequently at 20 W/in$^2$). In some embodiments, one or more pauses in ultrasonic wave generation may be introduced (for example, initially at 15 W/in$^2$, a pause of 10 seconds, and subsequently at 20 W/in$^2$). In such embodiments, the length of the pause can be suited to the particular application and article to be cleaned. As non-limiting examples, the pause can be 0-5 seconds, 5-10 seconds, 10-15 seconds, or 15-20 seconds.

The provided methods, in certain embodiments, are configured for cleaning substantially planar articles (including, but not limited to, plasma processing chamber windows). In such embodiments, the apparatus is also configured for cleaning such articles. In methods configured for cleaning plasma processing chamber windows, the window is received by the intermediate support such that the plasma-facing surface of the window is oriented toward the bottom portion of the tank and the opposing exterior-facing surface of the window is oriented toward the top portion of the tank. However, the window could alternatively be received by the support in the opposite orientation. When cleaning fluid is introduced into the tank, it flows from the plurality of cleaning fluid inlets, by the plasma-facing surface of the window (when oriented to face the bottom portion of the tank), through the window aperture, by the exterior-facing surface of the window (when oriented to face the top portion of the tank), and to (and out of) the plurality of fluid outlet ports proximate to the top portion of the tank. In such embodiments, at least the plasma-facing surface of the window is contacted with ultrasonic waves. Optionally, the exterior-facing surface may also be contacted with ultrasonic waves. In either instance, the apparatus is configured to remove particles from the window surfaces and carry them out of the tank with low incidence of recirculation (stagnation), thereby inhibiting particle redeposition. Thus, the provided methods are suitable for providing an ultra-clean window.

EXAMPLES

The described embodiments will be better understood by reference to the following examples which are offered by way of illustration and which one of skill in the art will recognize are not meant to be limiting.

Example 1

As illustrated in FIG. 1, a provided apparatus 100 may be configured to clean substantially planar articles including, but not limited to, quartz windows 105 of a plasma processing chamber. Such apparatus 100 comprises a substantially circular tank 110 comprising a top portion 115, a bottom portion 120, and a sidewall 125 disposed therebetween. The sidewall 125 has a plurality of apertures 130 proximate to the bottom portion 120 and a plurality of fluid outlet ports 135 proximate to the top portion 115. The apparatus 100 further comprises a plurality of cleaning fluid inlets (not shown) for delivering a cleaning fluid to the tank 110, each inlet at least partially disposed within one of the apertures 130 proximate to the bottom portion 120 of the tank 110.

The apparatus 100 additionally comprises an intermediate support 140 configured to maintain a window 105 suspended in the tank 110 and cleaning fluid above the plurality of cleaning fluid inlets and below the plurality of fluid outlet ports 135 proximate to the top portion 115 of the tank 110. The intermediate support 140 comprises an upper support surface 145 and a base structure 150. The base structure 150 comprises a plurality of radial cleaning fluid passages 155 extending through the base structure 150 from the outer circumference (not labeled) of the support 140 to an inner circumference (not labeled) of the support 140.

Figure 2:
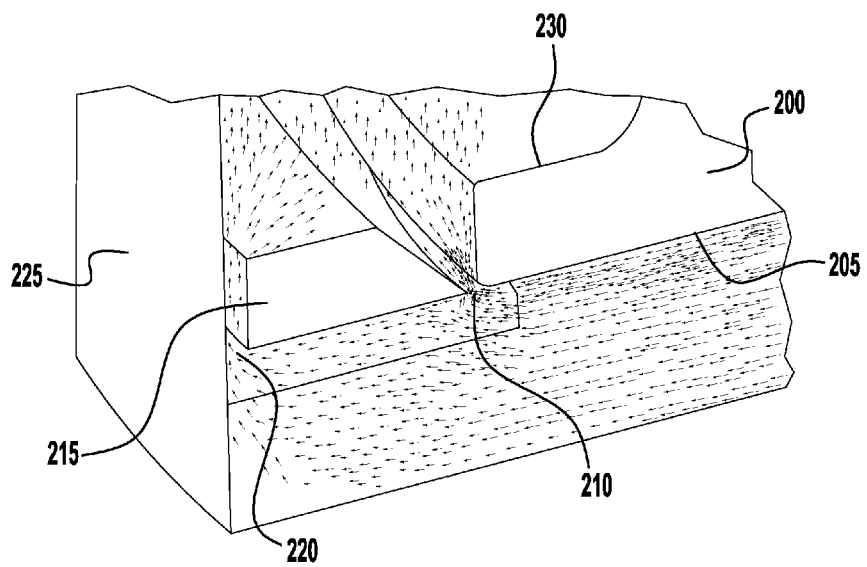
FIG. 2 illustrates certain optional configurations of the provided apparatus, namely how cleaning fluid may (i) flow through an inner circumferential fluid gap between a substantially planar article and an intermediate support submerged in the tank; and/or (ii) flow through an outer circumferential fluid gap between the intermediate support and tank sidewall.

The apparatus 100 is configured to receive cleaning fluid from the cleaning fluid inlets, remove particles from a quartz window 105, and direct flow of cleaning fluid at least up through the aperture 165 of the quartz window 105 such that removed particles are carried away from the quartz window 105 and out of the tank. As illustrated in FIG. 2, the intermediate support 215 may be configured to receive the window 200 in a manner such that the plasma-facing surface 205 of the window 200 is oriented to face the bottom portion (not labeled) of the tank. In such embodiments, cleaning fluid can additionally flow across the plasma-facing surface 205 of the window 200 and (i) up through an aperture (not shown) in the window 200; (ii) up through a substantially discontinuous inner circumferential fluid gap 210 between the window 200 and an intermediate circumference (not labeled) of the support 215; (iii) up through a substantially continuous outer circumferential fluid gap 220 between an outer circumference (not labeled) of the support 215 and an inner circumference of the tank sidewall 225; or (iv) combinations thereof. Before exiting the tank, the cleaning fluid flows across at least a portion of the other surface 230 of the quartz window 200.

Example 2

Figure 3:
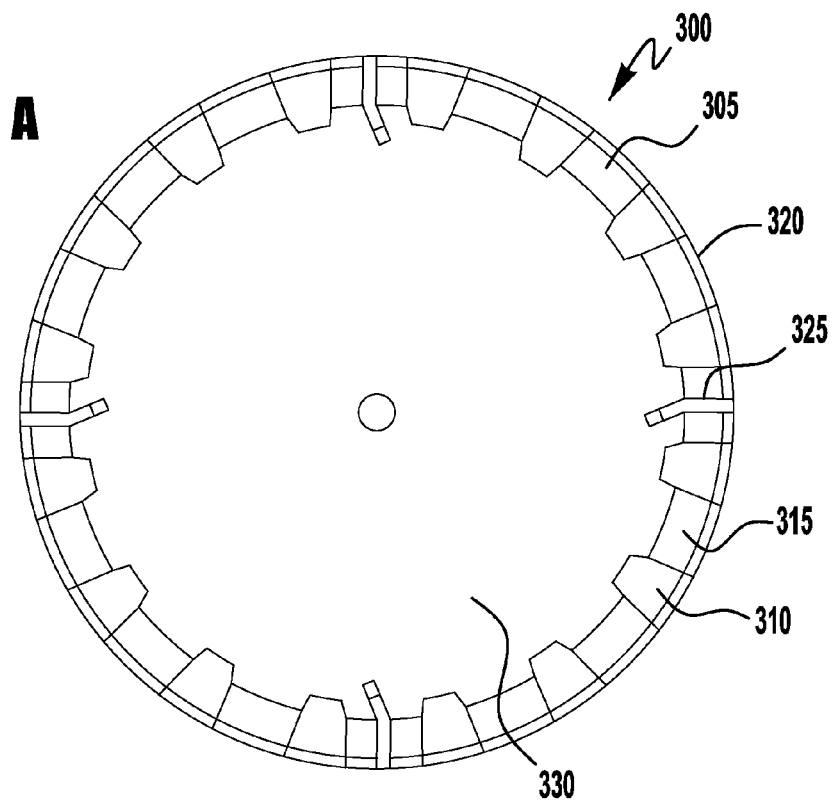
FIG. 3 is A, a bottom view (bottom of tank not shown) of one example of a provided cleaning apparatus assembled with a substantially planar article to be cleaned, said view illustrating an apparatus having four equidistantly placed cleaning fluid inlets, each disposed within a radial cleaning fluid passage of the intermediate support; and B, one example of an angled nozzle injector.
Figure 3:
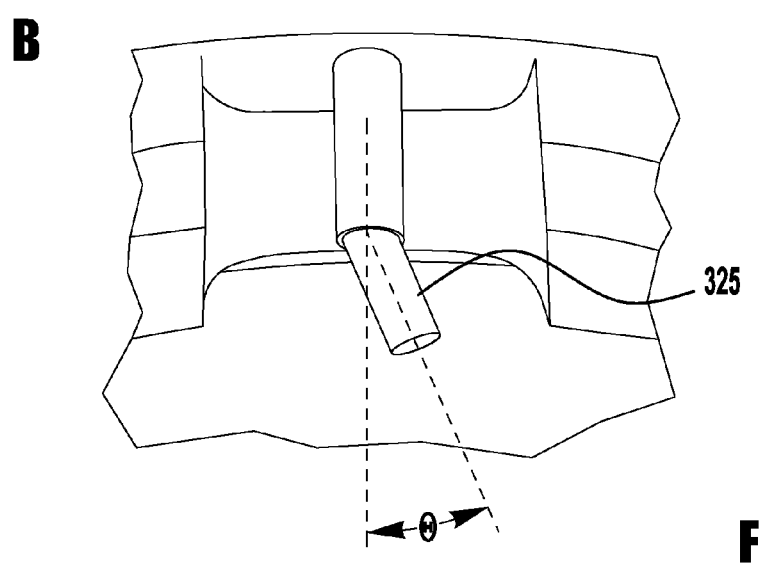
Figure 4:
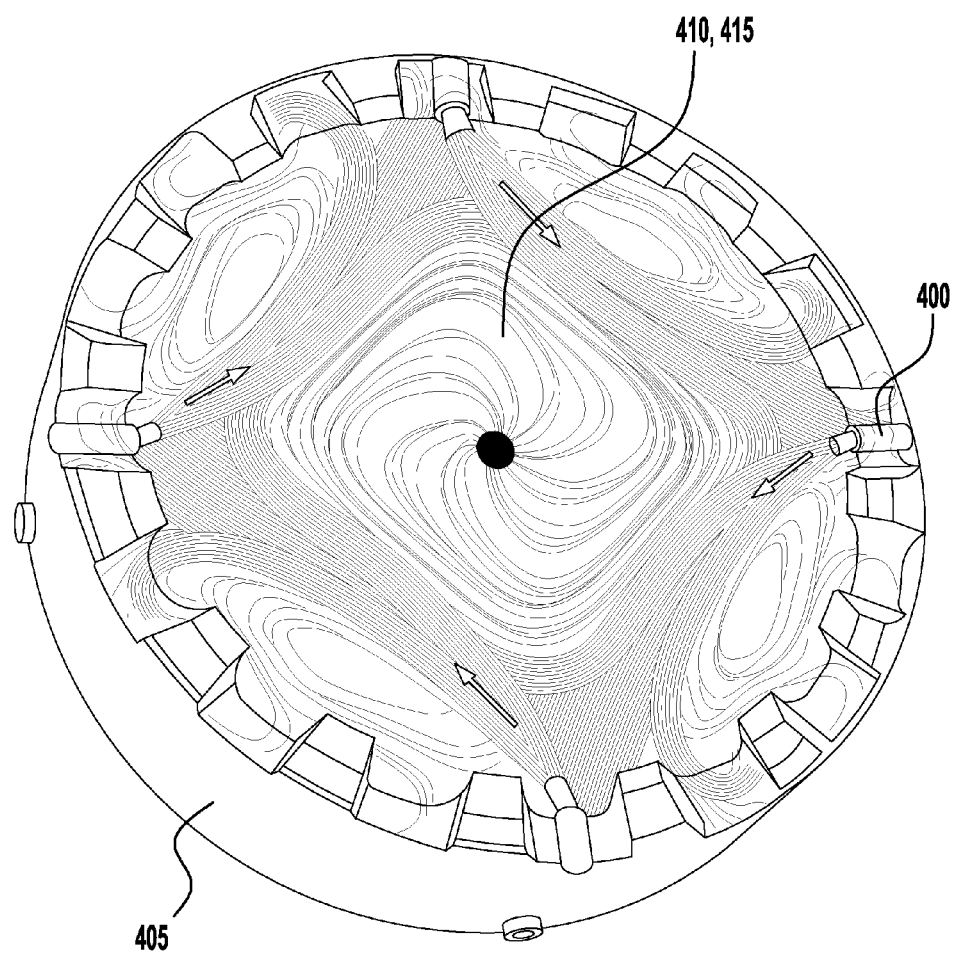
FIG. 4 illustrates one example of how the apparatus of FIG. 3 can be configured to direct flow of cleaning fluid between the bottom of the tank and the bottom-facing surface of the article to be cleaned.

As illustrated in FIG. 3, the provided apparatus 300 comprises an intermediate support 305. The bottom of the support 305 is shown. The base structure 310 of the support 305 comprises a plurality of radial cleaning fluid passages 315 extending through the base structure 310 from an outer circumference to an inner circumference. The apparatus 300 further comprises a plurality of cleaning fluid inlets 325 for delivering cleaning fluid to the tank 320. Among the types of inlets 325 that can be selected are angled nozzle injectors. As shown, the apparatus 300 has four equidistantly spaced injectors 325, each having an offset angle of approximately 20°. However, other offset angles are also within the scope of the present disclosure. In the configuration shown, cleaning fluid flow can be directed across the bottom-facing window surface 330 (for example, the plasma-facing surface of the window). FIG. 4 illustrates that when the offset angle of each injector 400 is oriented in the same general direction, vortical flow of the cleaning fluid is introduced in the tank 405 and across the bottom-facing (plasma-facing) surface 410 of the quartz window 415.

Example 3

Figure 5:
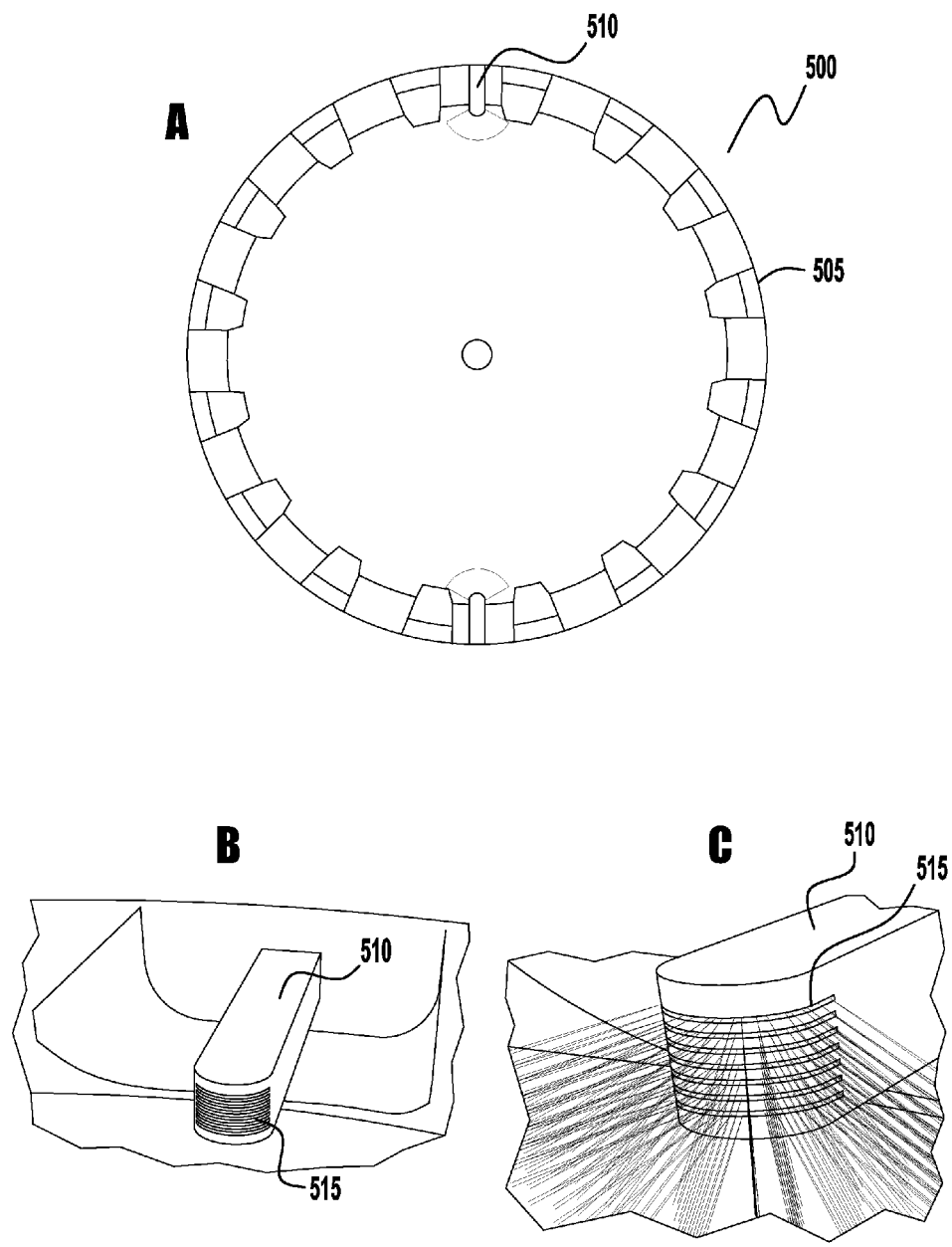
FIG. 5 is A, a bottom view (bottom of tank not shown) of one example of a provided cleaning apparatus assembled with a substantially planar article to be cleaned, said view illustrating an apparatus having two equidistantly placed cleaning fluid inlets, each disposed within a radial cleaning fluid passage of the intermediate support; B, one example of an multi-slotted fan injector, each slot being in a different plane; and C, an example of how the multi-slotted fan injector can be configured to deliver cleaning fluid into the tank.
Figure 6:
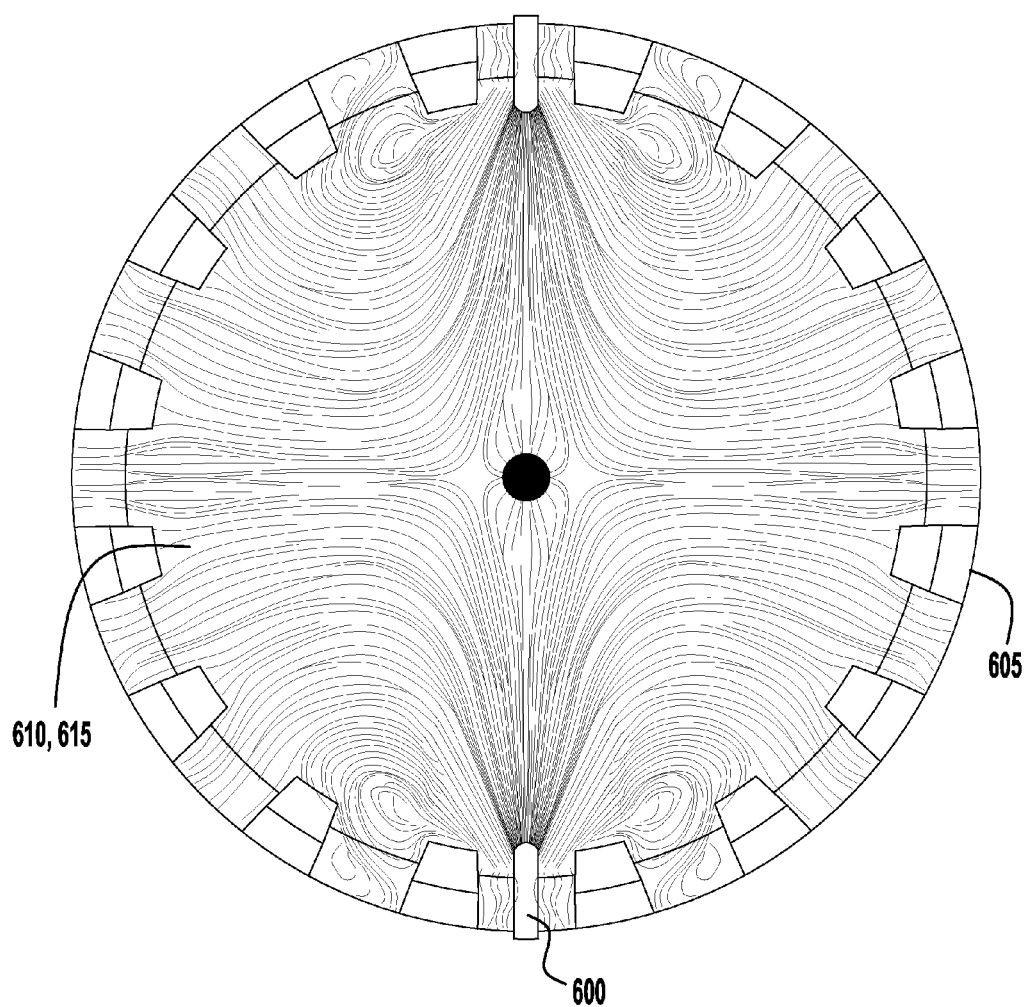
FIG. 6 illustrates one example of how the apparatus of FIG. 5 can be configured to direct flow of cleaning fluid between the bottom of the tank and the bottom-facing surface of the article to be cleaned.

As illustrated in FIG. 5, the provided apparatus 500 comprises a plurality of cleaning fluid inlets 510 for delivering cleaning fluid into the tank 505. Among the types of inlets 510 that can be selected are fan injectors. As shown, the apparatus 500 has two seven-slotted fan injectors 510, each slot 515 configured to introduce fluid in a fan of approximately 180° coverage. However, other fan coverage angles are also contemplated. As illustrated in FIG. 6, with such injectors 600 in such configuration, vortical flow of the cleaning fluid is introduced in the tank 605 and across the bottom-facing (plasma-facing) surface 610 of the quartz window 615 with low incidence of recirculation.

The present disclosure should not be considered limited to the specific examples described herein. Various modifications, equivalent processes, as well as numerous structures and devices to which the present disclosure may be applicable will be readily apparent to those of skill in the art. Those skilled in the art will understand that various changes may be made without departing from the scope of the disclosure, which is not to be considered limited to what is described in the specification.

What is claimed is:

1. A method of cleaning a substantially planar article, comprising:
   providing a tank comprising (i) a top portion, (ii) a bottom portion, and (iii) a sidewall disposed therebetween, the tank configured to contain a cleaning fluid and to receive a substantially planar article submerged in the cleaning fluid; (iv) a plurality of cleaning fluid inlets at least partially disposed in the sidewall; (v) a plurality of fluid outlet ports disposed in the sidewall; (vi) an intermediate support for receiving the substantially planar article, the support comprising an upper support surface, a base structure opposite the upper support surface, and a plurality of radial cleaning fluid passages extending through the base structure from an outer circumference of the support to an inner circumference of the support; and (vii) an ultrasonic generator coupled to the tank for generating ultrasonic waves in the tank and the cleaning fluid received therein;
   introducing the substantially planar article to be cleaned into the tank such that the substantially planar article is received and maintained by the support above the plurality of cleaning fluid inlets and below the plurality of fluid outlet ports;
   introducing the cleaning fluid into the tank through the plurality of cleaning fluid inlets;
   exciting the cleaning fluid with ultrasonic waves; and
   allowing the cleaning fluid to flow out of the tank through the plurality of fluid outlet ports;
   wherein particles are removed from the substantially planar article and carried by flow of the cleaning fluid away from the substantially planar article and out of the tank.

2. A method according to claim 1, wherein the substantially planar article is a plasma processing chamber window having a plasma-facing surface and an opposing exterior-facing surface, and wherein the window is introduced into the tank such that the plasma-facing surface is oriented toward the bottom portion of the tank.

3. A method according to claim 2, wherein the cleaning fluid inlets of the apparatus are selected from nozzle injectors, fan injectors, and combinations thereof.

4. A method according to claim 3, wherein cleaning fluid is introduced into the tank through either (i) four angled nozzle injectors, each having an offset angle of 20°; or (ii) two seven-slotted fan injectors, each slot configured to introduce cleaning fluid in a 180° fan.

* * * * *